United States Patent
Lee et al.

(10) Patent No.: US 6,819,594 B2
(45) Date of Patent: Nov. 16, 2004

(54) ELECTRICALLY ERASABLE PROGRAMMABLE LOGIC DEVICE

(75) Inventors: Kung-Hong Lee, Ping-Tung Hsien (TW); Ching-Hsiang Hsu, Hsin-Chu (TW); Ya-Chin King, Tao-Yuan Hsien (TW); Shih-Jye Shen, Hsin-Chu (TW); Ming-Chiu Ho, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/248,282

(22) Filed: Jan. 6, 2003

(65) Prior Publication Data

US 2004/0130950 A1 Jul. 8, 2004

(51) Int. Cl.[7] .................................................. G11C 16/04
(52) U.S. Cl. ........................... 365/185.18; 365/185.01; 365/185.29
(58) Field of Search ...................... 365/185.18, 185.01, 365/185.29

(56) References Cited

U.S. PATENT DOCUMENTS 6,266,278 B1 * 7/2001 Harari et al. .......... 365/185.18
6,377,490 B1 * 4/2002 Takahashi et al. ..... 365/185.29

* cited by examiner

Primary Examiner—Huan Hoang
(74) Attorney, Agent, or Firm—Winston Hsu (57) ABSTRACT

An electrically erasable programmable logic device includes a P-type substrate, a first N-type doped region located inside the P-type substrate, and a first gate located on the P-type substrate. The first gate is adjacent to the first N-type doped region, is in a floating state, and is used for storing data. A second N-type doped region is located inside the P-type substrate adjacent to the first gate. A second gate is located on the P-type substrate and adjacent to the second N-type doped region and acts as a select gate. A third N-type doped region is located inside the P-type substrate adjacent to the second gate.

30 Claims, 8 Drawing Sheets

ELECTRICALLY ERASABLE PROGRAMMABLE LOGIC DEVICE

BACKGROUND OF INVENTION

1. Field of the Invention

The present invention provides an electrically erasable programmable logic device, and more specifically, an erasable programmable logic device with reduced volume, which makes use of the standard COMS layout process.

2. Description of the Prior Art

With demands for portable electrical products in recent years, techniques of manufacturing electrically erasable programmable read-only memories (EEPROMs) have matured and the market has expanded. EEPROMs can be applied in digital cameras, video game consoles, personal digital assistants, telephone recording devices, and programmable IC products. An EEPROM is a non-volatile memory, which changes threshold voltages of transistors or memory cells to control opening and closing of corresponding gate channels to store memory data protected from loss because of power shutdown.

A prior art EEPROM uses a stacked gate technique wherein a memory cell is located on a substrate, and is composed of a drain, a source, and a stacked gate. The stacked gate is usually composed of a floating gate and a select gate wherein a double oxide layer isolates the floating gate and the substrate, the select gate and the floating gate. The stacked gate technique used in EEPROM applies a high potential voltage to the select gate to change stored electron amounts in the floating gate by electron FN tunneling effects or hot electrons injection which eventually changes the threshold voltage of the select gate and records data.

Figure 1:
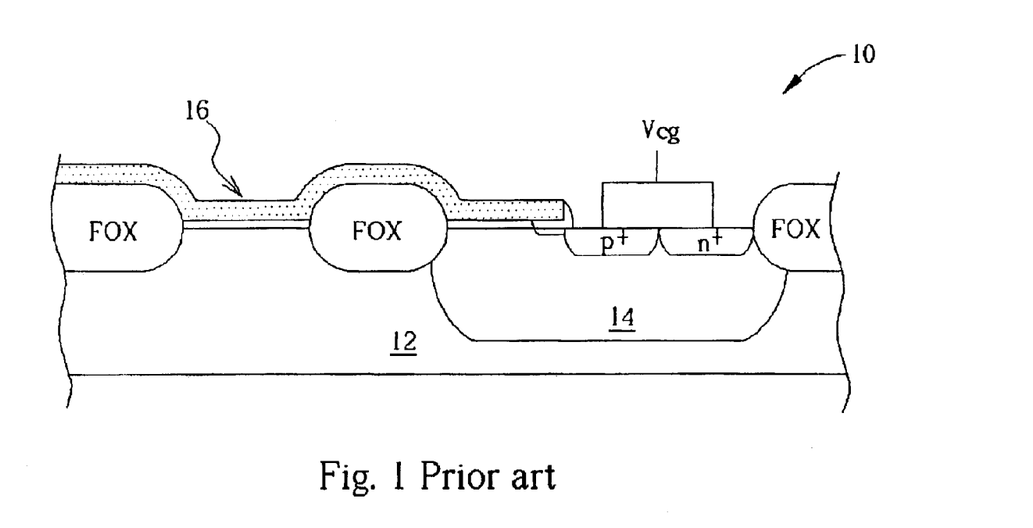
FIG. 1 is a cross-sectional diagram of a prior art single-poly memory cell.

However, the structure of memory cells applied in EEPROM with a stacked gate technique is complicated to be generated by a standard complementary metal oxide semiconductor (CMOS) layout processing, and requires a more costly and complex processing. Therefore, the prior art, which is disclosed by R. Kazerounian and B. Eitann, "A single-poly EPROM for custom CMOS logic applications", IEEE Custom Integrated Circuits Conference, p.59–62, 1986, claims another structure of single-poly memory cell. Please refer to FIG. 1. Illustrated in FIG. 1 is a lateral sectional diagram of a prior art single-poly memory cell 10, which is located on a substrate 12. An n-well is provided to be a coupling gate for a floating gate 16 in order to couple a high potential voltage, 9 to 12V, to the floating gate 16 through the coupling gate and further to generate channel hot electrons in the substrate 12 beneath the floating gate 16. By injection of the channel hot electrons to the floating gate 16, threshold potential of the floating gate will be altered which results in programming the memory cell 10. Because the single-poly structure is simple, it can be generated with standard COMS layout processing instead of the costly stacked gates technique.

There is still a major defect in the prior art single-poly memory cell 10: a large N-type well 14 having a relatively large area measure has to be applied to couple high potential voltage to the floating gate 16. The area measure of the N-type well is larger than other parts of the memory cell by 10 or more times which prevents the memory volume applied with the single-poly memory cell 10 from being reduced.

SUMMARY OF INVENTION

It is therefore a primary objective of the claimed invention to provide a electrically erasable programmable logic device that stores data by applying single-poly cell memory which is provided with a floating gate and a floating doped region to overcome the problems of the prior art.

According to the claims of the present invention, an electrically erasable programmable logic device is claimed to be applied as a memory cell. The electrically erasable programmable logic device comprises a P-type substrate, a N-type doped region located in the P-type substrate, a first gate being in a floating state located on the P-type substrate adjacent to the N-type doped region and used to store data of the electrically erasable programmable logic device, a second N-type doped region being in a floating state located in the P-type substrate adjacent to the first gate, a second gate adjacent to the second N-type doped region being a select gate of the electrically erasable programmable logic device, and a third N-type doped region located in the P-type substrate adjacent to the second gate.

An electrically erasable programmable logic device of the present invention applies a second gate to control voltage potential of a second N-type doped region in order to further control voltage potential of a first gate in order to generate channel hot holes or channel hot electrons in a P-type substrate under the first gate. The channel hot hole or channel hot electrons can be applied to change the threshold of the first gate to alter data stored in the logic device.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 2:
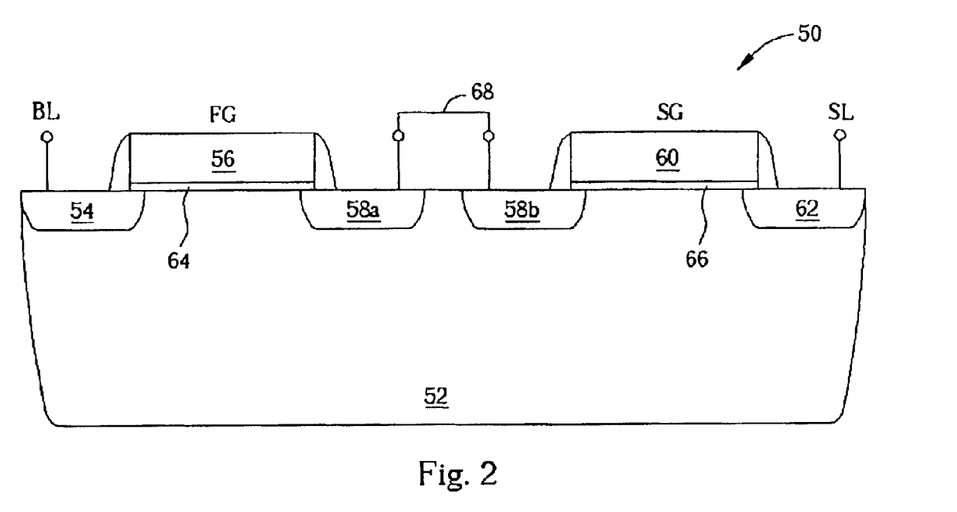
FIG. 2 is a cross-sectional diagram of a present invention electrically erasable programmable logic device.

Please refer to FIG. 2. Illustrated in FIG. 2 is a cross-sectional diagram of a present invention electrically erasable programmable logic device 50. The electrically erasable programmable logic device 50 comprises a P-type substrate 52, an N-type doped region 54 located in the P-type substrate 52, and a first gate 56 in a floating state located on the P-type substrate 52 and adjacent to the N-type doped region 54 being provided to be a floating gate for the electrically erasable programmable logic device 50 to store non-volatile data. The electrically erasable programmable logic device 50 further comprises a second N-type doped region 58a located in the P-type substrate 52 and adjacent to the first gate 56, a third N-type doped region 58b located in the P-type substrate 52 connected electrically to the second N-type doped region 58b, a second gate 60 located on the P-type substrate 52 and adjacent to the third N-type doped region 58b being provided to be a select gate of the electrically erasable programmable logic device 50, and a third N-type doped region 62 located in the P-type substrate 52 adjacent to the second gate 60. It is known to those skilled in the art that the first gate 56 (the floating gate) and the second gate 60 (the select gate) comprise a first oxide layer 64 and a second oxide layer 66 located in the base of the floating gate 56 and the select gate 60 to prevent the two gates 56, 60 from directly connecting to the P-type substrate 52 by isolating the two gates 56, 60 and the P-type substrate 52. The second and the third N-type doped regions 58a and 58b can be connected electrically by a variety of materials such as a metal wire 68 in FIG. 2. The following is an embodiment of the present invention.

Figure 3:
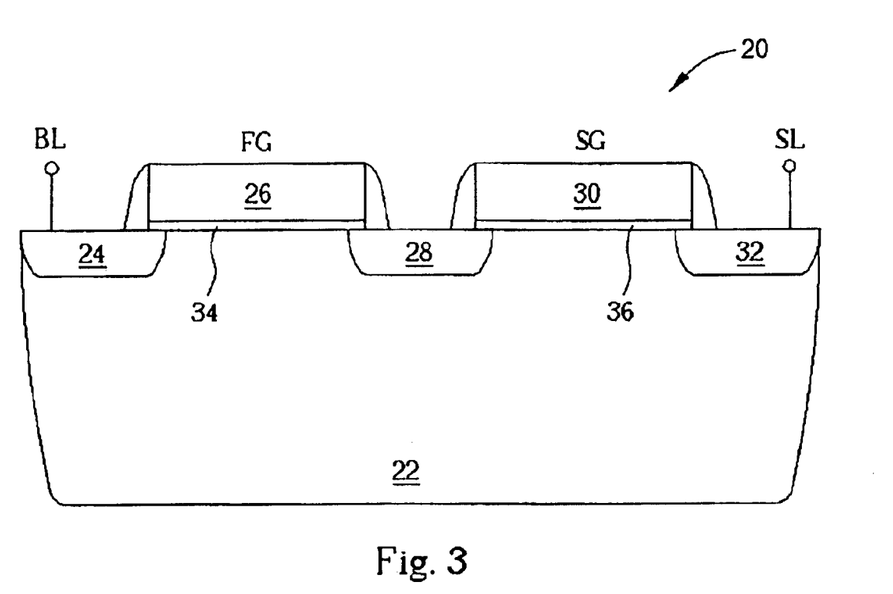
FIG. 3 is a cross-sectional diagram of an embodiment of the electrically erasable programmable logic device illustrated in FIG. 2.

Please refer to FIG. 3. Illustrated in FIG. 3 is a cross-sectional diagram of a present invention erasable programmable logic device 20. Please notice that the electrically erasable programmable logic device 20 illustrated in FIG. 3 combines the second and the third N-type doped regions 58a and 58b of the electrically erasable programmable logic device 50 illustrated in FIG. 2 into a single N-type doped region. The electrically erasable programmable logic device 20 comprises a P-type substrate 22, a first N-type doped region 24 located in the P-type substrate 22, and a first gate 26 in a floating state located on the P-type substrate 52 and adjacent to the N-type doped region 54 being provided to be a floating gate for the electrically erasable programmable logic device 20 to store non-volatile data. The electrically erasable programmable logic device 20 further comprises a second N-type doped region 28 located in the P-type substrate 22 and adjacent to the first gate 26, a second gate 30 located on the P-type substrate 22 and adjacent to the second gate 28 being provided to be a select gate of the electrically erasable programmable logic device 20, and a third N-type doped region 32 located in the P-type substrate 22 and adjacent to the second gate 30. It is known to those skilled in the art that the first gate 26 (the floating gate) and the second gate 30 (the select gate) usually comprise a first oxide layer 34 and a second oxide layer 36 respectively which are located on the base of the floating gate 26 and the select gate 30 to keep the two gates 26, 30 from directly connecting to the P-type substrate 22 by isolating the two gates 26, 30 and the P-type substrate 22. The following illustrated electrically erasable programmable logic device 20 of the present invention is a preferred embodiment of a memory cell.

Figure 4:
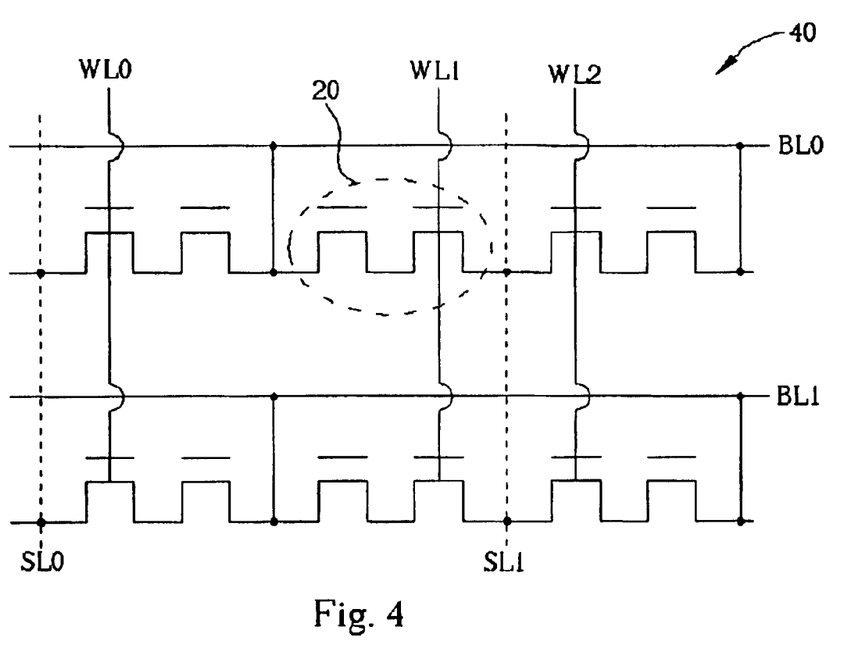
FIG. 4 is a schematic diagram of electrically erasable programmable logic devices illustrated in FIG. 3 arranged in an array in a memory.
Figure 5:
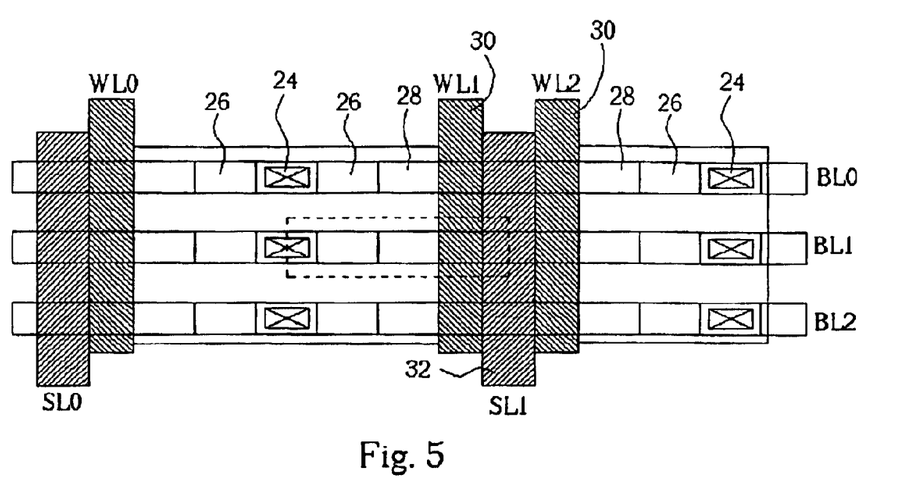
FIG. 5 is schematic diagram of layouts of the memory illustrated in FIG. 4.

Please refer to FIG. 4 and FIG. 5. Illustrated in FIG. 4 is a schematic diagram of the electrically erasable programmable logic device 20 arranged in an array in a memory 40. Illustrated in FIG. 5 is a schematic diagram of layouts of the memory 40 illustrated in FIG. 4. The memory 40 illustrated in FIG. 4 could be an electrically erasable programmable read-only memory (EEPROM) or a one-time programmable memory (OTP memory), wherein the memory 40 performs read, program, and functions as an EEPROM or performs read and program functions as an OTP. As illustrated in FIG. 4, the memory 40 comprises a plurality of electrically erasable programmable logic devices 20 (an area circled in a dotted line represents a logic device 20 of FIG. 4), which are arranged in arrays having a plurality of columns and rows. In this embodiment, logic devices 20 are allocated in mirrored symmetry which means that if a logic device 20 is provided with an N-type doped region on its left side and a third doped region on its right side, two other logic devices located adjacent on the left and right will be provided with a third N-type doped region 32 on the left and a first N-type doped region 24 on the right.

In the embodiment, the memory 40 is organized as follows: the second gates 30 (select gate) of logic devices 20 located in the same row connect electrically to a word line WL, the third N-type doped regions 32 of logic devices 20 located in the same row connect to a source line SL, and the first N-type doped regions 24 of logic devices 20 located in the same row connect to a bit line BL. As illustrated in FIG. 4, according to locations of each logic device 20 in the array used as a memory cell of the memory 40, word lines can be listed in order of WL0, WL1, WL2, to WLX, source lines can be listed in order of SL0, SL1, SL2, to SLX, and bit lines can be listed in order of BL0, BL1, BL2, to BLX. Besides, as illustrated in FIG. 5, as any two logic devices 20 adjacent to each other are allocated in mirrored symmetry, any two logic devices 20 of neighboring rows located on the same line in the layout can share their two neighboring N-type doped regions 24, and any two logic devices 20 of neighboring rows located in on the same line in the layout can share the two neighboring third doped regions 32 to reduce occupied space.

Taking the logic device 20 in the memory 40 illustrated in FIG. 4 as an example to show how to apply the logic device 20 as a memory cell. As mentioned above, the first gate 26 of the logic device 20 is in a floating state, which means that no external signal or electricity connects the first gate 26 used as the floating gate for the logic device 20. The function of the floating gate 26 is similar to the floating gate of a memory cell in the prior art applied with the stacked gate technique to make use of amounts of stored electrons in the floating gate 26 to store data by changing the threshold of the floating gate 26. The floating gate 26 being at a high $V_{TH}$ state and low $V_{TH}$ state representing different values of stored binary digital data in a logic device 20, which can be a logical "1" or "0". A so-called high $V_{TH}$ state means that due to more electrons stored in the floating gate 26, the floating gate 26 needs a relatively high potential to attract enough electrons in the P-type substrate 22 beneath the floating gate 26 to form a channel in order to connect electrically to a first N-type doped region 24 and a second N-type doped region 28. Similarly, a so-called low $V_{TH}$ state means that due to more holes stored in the floating gate 26, the floating gate 26 needs a relatively low potential to attract enough electrons in the P-type substrate 22 beneath the floating gate 26 to form a channel in order to connect electrically to a first N-type doped region 24 and a second N-type doped region 28. In the following description, the floating gate 26 being at a high $V_{TH}$ state represents a logic device 20 storing a logical "0", and the floating gate 26 being at a low $V_{TH}$ state represents a logic device 20 storing a logical "1"; the opposite definition to the above mentioned is also claimed in the present invention.

Figure 6:
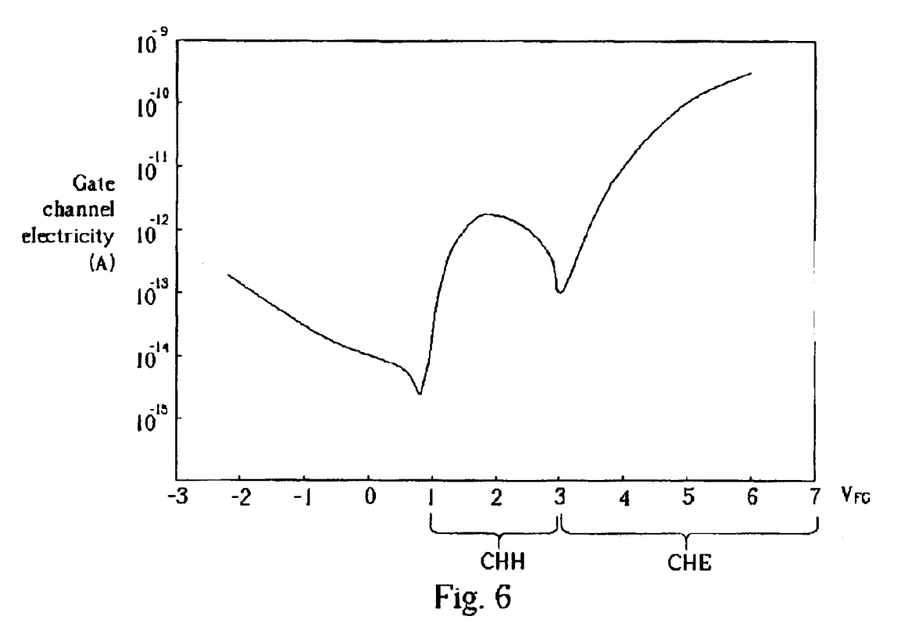
FIG. 6 is a graph of floating gate channel electricity relative to distributed voltage in the present invention electrically erasable programmable logic gate.

Please refer to FIG. 6. illustrated in FIG. 6 is a graph of floating gate channel electricity relative distributed voltage of the floating gate 26 in the present invention electrically erasable programmable logic device 20, wherein the horizontal axis represents the potential of the floating gate 26 and the vertical axis represents the gate electricity of the floating gate 26. Please notice that the represented gate electricity of the floating gate only represents an absolute value and not a direction. Additionally, label CHH represents the gate electricity generated by channel hot holes and label CHE represents the gate electricity generated by channel hot electrons. It can be seen from the graph that while the potential value of the floating gate 26 increases, such as from 2V to 6V, the zone labeled as CHH appears first to represent the channel hot hole effects, and the zone labeled as CHE appears later to represent the channel hot electron effects. The situation of gate electricity generated by channel hot holes and channel hot electrons is due to that when the floating gate 26 and the select gate 30 have been turned on, electrons will pass through the channel beneath the turned-on gates 26 and 30 to flow into the third N-type doped region 32 and the first N-type doped region 24. Some of the electrons will impact and ionize atoms of the P-type substrate 22 to generate electron-hole pairs at the PN junction between the first N-type doped region 24 and the P-type substrate 22, and the lucky hot electrons or holes will tunnel into the floating gate 26 according to different gate voltage potential states, which generates the gate electricity.

Because the floating gate 26 of the logic device 20 of the present invention is in a floating state, the generated voltage potential is achieved by coupling voltage potential of the first N-type doped region 24 (bit line), the P-type substrate 22, and the second N-type doped region 28 according to a certain ratio. In other words, if voltage potentials of the bit line, of the P-type substrate 22, and of the second N-type doped region 28 are $V_{BL}$, $V_{PS}$, and $V_X$ the voltage potential of the floating gate $V_{FG}$ could be represented as follows:

$$V_{FG} = \alpha_1 V_{BL} + \alpha_2 V_{PS} + \alpha_3 V_X + (Q/C_{ox})$$

where $\alpha_1$, $\alpha_2$, $\alpha_3$ are coupling ratio respectively of the first N-type doped region 24, the P substrate 22, and the second N-type doped region 28, Q is quantity of charges injected into the floating gate 26, and $C_{ox}$ is capacitance of the first oxide layer 34. Due to the second N-type doped region 28 of the logic device 20 in the present invention is in a floating state too, the voltage potential takes use of the voltage potential $V_{SG}$ of the select gate 30 (WL) to control the resistance of the channel beneath it to determine the coupling level of the voltage potential $V_{SL}$ of the third N-type doped region 32 (SL) to the second N-type doped region 28. In the embodiment, parameters of "program" and "erase" functions of the present invention logic device 20 will be determined by the above-mentioned fixed numbers $V_{BL}$, $V_{PS}$, $V_{SL}$, and the voltage potential $V_{FG}$ of the floating gate 26 is affected by changing potential value of $V_{SG}$ which changes the stored electron amounts in the floating gate 26 so as to alter the threshold potential of the floating gate 26. The following is the detailed description of how to perform "read", "program", and "erase" functions in the preferred embodiment of the present invention logic device 20.

When the memory 40 performs a "read" function on the selected logic device 20 of its memory cell, the first N-type doped region 24 (BL) is connected to ground which makes a voltage level at the select gate (WL) 30 exceed a voltage level at the third N-type doped region 32 (SL) by a predetermined value (which is usually the threshold of the select gate 30) so as to form a channel in the P-type substrate 22 beneath the select gate 30 and conduct the second N-type doped region 28 to the third N-type doped region 32. In the preferred embodiment, the select gate 30 inputs 1.8V through a word line WL, and the third N-type doped region 32 inputs 1V through a source line SL. Please notice that other select gates 30 and third N-type doped region 32 of the logic device 20 input 0V. If the floating gate 26 is in a high threshold potential state, meaning that the logical value stored in the logic device 20 is "0", a potential difference exists between the first N-type doped region 24 and the floating gate 26, and the second N-type doped region 28 is not big enough to turn on the channel beneath the floating gate 26, a sense amplifier (not shown) will read a logical "0" from the bit line BL. In contrast, if the floating gate 26 is at low threshold potential state, meaning that the logical value stored in the logic device 20 is "0", a potential difference exists between the first N-type doped region 24 and the floating gate 26, and the second N-type doped region 28 is big enough to turn on the channel beneath the floating gate 26, the sense amplifier will read a logical "1" from the bit line BL. Please notice that the above-mentioned sense amplifier could be modified according to different demands and different voltage potential designs.

Figure 7:
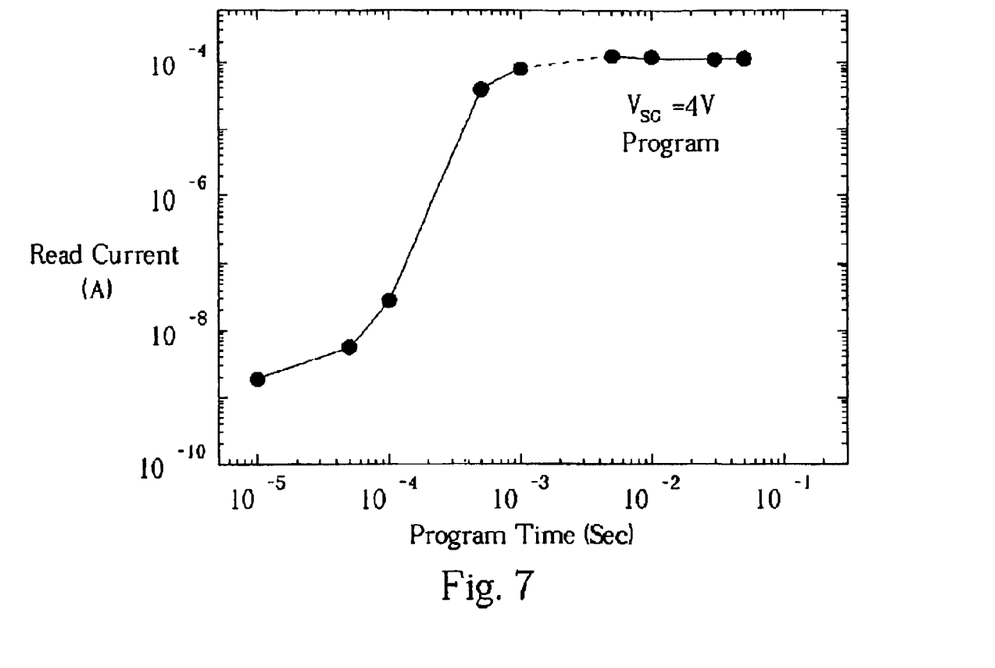
FIG. 7 is a schematic diagram plotting the read current versus stress time under bit line voltages $V_{BL}=8V$ and select gate voltage $V_{SG}=4V$ at a program mode.

When the memory 40 performs a "program" function on the selected logic device 20 of its memory cell, the first N-type doped region 24 is electrically connected to a high voltage level, the third N-type doped region 32 is connected to ground, and the select gate 30 is electrically connected to a predetermined voltage value so as to form channel hot holes in the P-type substrate beneath the floating gate 26 wherein the predetermined voltage value lies in the CHH region of FIG. 6 to ensure the forming of channel hot holes. In the preferred embodiment, the first N-type doped region 24 inputs 8V through the bit Line BL, and the select gate 30 inputs 4V through the word line WL. Please notice that other select gates 30 and first N-type doped region 24 of the logic device 20 input 0V. If the floating gate 26 is at high threshold potential state, meaning that the logical value stored in the logic device 20 is "0", due to more electrons being stored in the floating gate 26 the floating gate 26 will attract channel hot holes generated in the P-type substrate 22 beneath it until the floating gate 26 stores more electrons. The floating gate 26 will switch to a low threshold potential state through the process, and the stored logical value in the logic device 20 is programmed to be "1". If the floating gate 26 is at a low threshold potential, meaning that the logical value stored in the logic device 20 is "1", due to more holes being stored in the floating gate 26 in the beginning, the generated channel hot holes will make no change to the stored logical value in the logic device 20 which will remain a "1". Illustrated in FIG. 7 is a schematic diagram plotting the read current versus stress time under bit line voltages $V_{BL}$=8V and selected gate voltage $V_{SG}$=4V at a program mode wherein the vertical axis represents read current, the horizontal axis represents programming time, and the read current represents the current value detected from a bit line during a "read" mode. When the memory 40 performs a "program" function on the selected logic device 20 of its memory cell, after a proper reaction time (as the dotted line positioned about $10^{-3}$ to $10^{-2}$ second range in FIG. 7), at a "read" mode, the read current will be switched from low to high, representing that the threshold potential being switched from high to low so that the stored logic value can be read as "0" but not "1".

Figure 8:
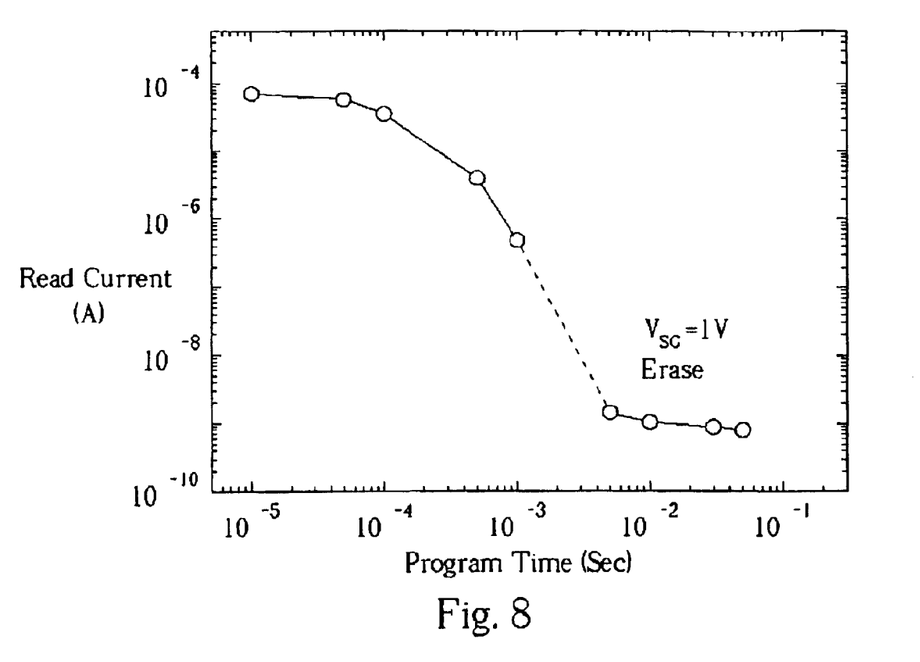
FIG. 8 is a schematic diagram plotting the read current versus stress time under bit line voltages $V_{BL}=8V$ and select gate voltage $V_{SG}=1V$ at an erase mode.

When the memory 40 performs an "erase" function on the selected logic device 20 of its memory cell, the first N-type doped region 24 is electrically connected to a high voltage level, the third N-type doped region 32 (SL) is connected to ground, and the select gate 30 (WL) is electrically connected to a predetermined voltage value so as to form channel hot electrons in the P-type substrate 22 beneath the floating gate 26, wherein the predetermined voltage value lies in the CHE region of FIG. 6 to ensure the forming of channel hot electrons. In the preferred embodiment, the first N-type doped region 24 inputs 8V through the bit line BL, and the select gate 30 inputs 1V through the word line WL. Please notice that other select gates 30 and first N-type doped region 24 of the logic device 20 input 0V. If the floating gate 26 is at a low threshold potential state, meaning that the logical value stored in the logic device 20 is "1", due to more holes being stored in the floating gate 26, the floating gate 26 will continuously attract channel hot electrons generated in the P-type substrate 22 beneath it until the floating gate 26 stores more electrons. The floating gate 26 will switch to be in a high threshold potential state through the process, and the stored logical value in the logic device 20 is programmed to be a "0". If the floating gate 26 is at a high threshold potential, meaning that the logical value stored in the logic device 20 is "0", due to more electrons being stored in the floating gate 26 in the beginning, the generated channel hot electrons will make no change to the stored logical value in the logic device 20 which will remain a "0". Illustrated in FIG. 8 is a schematic diagram plotting the read current versus stress time under bit line voltages $V_{BL}$=8V and selected gate voltage $V_{SG}$=1V at an erase mode wherein the vertical axis represents read current, the horizontal axis represents programming time, and the read current represents the current value detected from a bit line during a "read" mode. When the memory 40 performs an "erase" function on the selected logic device 20 of its memory cell, after a proper reaction time (as the dotted line positioned about $10^{-3}$ to $10^{-2}$ second range in FIG. 8), at a read mode, the read current will be switched from high to low, representing that the threshold potential being switched from low to high so that the stored logic value can be read as "1" but not "0".

Compared to the prior art, the present invention electrically erasable programmable logic device controls the voltage potential of a first N-type doped region by a second gate and further controls the voltage potential of a first gate to generate channel hot holes or channel hot electrons in a P-type substrate beneath the first gate. The generated channel hot holes and channel hot electrons can be applied to change the threshold voltage of the first gate to change data stored in the logic gate. Therefore, the present invention electrically erasable programmable logic device reduces the cost and size compared to the prior art, which uses a single-poly memory cell of a large N-type well.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An electrically erasable programmable logic device as a memory cell of a memory, comprising:
    a P-type substrate;
    a first N-type doped region in the P-type substrate;
    a first gate on the P-type substrate and adjacent to the first N-type doped region, the first gate being in a floating state and used for storing data of the electrically erasable programmable logic device;
    a second N-type doped region in the P-type substrate and adjacent to the first gate;
    a third N-type doped region in the P-type substrate being electrically connected to the second N-type doped region;
    a second gate as a select gate of the electrically erasable programmable logic device, the second gate being on the P-type substrate and adjacent to the third N-type doped region; and
    a fourth N-type doped region in the P-type substrate and adjacent to the second gate;
    wherein the first and second gates are formed in a single polysilicon layer that is the only polysilicon layer disposed on the P-type substrate of the electrically erasable programmable logic device.

2. The electrically erasable programmable logic device of claim 1 wherein the first gate comprises a first oxide layer on a bottom side of the first gate for isolating the P-type substrate and the first gate.

3. The electrically erasable programmable logic device of claim 1 wherein the second gate comprises a second oxide layer on a bottom side of the second gate for isolating the P-type substrate and the second gate.

4. The electrically erasable programmable logic device of claim 1 wherein the memory is an electrically erasable programmable read-only memory.

5. The electrically erasable programmable logic device of claim 1 wherein the memory is a one-time programmable memory.

6. The electrically erasable programmable logic device of claim 1 wherein a plurality of the electrically erasable programmable logic devices as the memory cells of the memory forms an array.

7. The electrically erasable programmable logic device of claim 6 wherein among the electrically erasable programmable logic devices forming the array, the second gates of the electrically erasable programmable logic devices in the same column are electrically connected to one another and to a word line, the fourth N-type doped regions of the electrically erasable programmable logic devices in the same column being electrically connected to one another and to a source line.

8. The electrically erasable programmable logic device of claim 6 wherein among the electrically erasable programmable logic devices forming the array, the electrically erasable programmable logic devices in adjacent columns are allocated in mirrored symmetry.

9. The electrically erasable programmable logic device of claim 8 wherein among the electrically erasable programmable logic devices in adjacent columns, the electrically erasable programmable logic devices in the same row share the first N-type doped region, the shared first N-type doped region being electrically connected to a bit line.

10. The electrically erasable programmable logic device of claim 8 wherein among the electrically erasable programmable logic devices in adjacent columns, the electrically erasable programmable logic devices in the same row share the fourth N-type doped region, the shared fourth N-type doped region being electrically connected to a source line.

11. The electrically erasable programmable logic device of claim 6 wherein among the electrically erasable programmable logic devices forming the array, the first N-type doped regions of the electrically erasable programmable logic devices in the same row are electrically connected to one another and to a bit line.

12. The electrically erasable programmable logic device of claim 1 wherein when the first gate is at a high threshold voltage state, the memory cell stores a logical "0", and when the first gate is at a low threshold voltage state, the memory cell stores a logical "1".

13. The electrically erasable programmable logic device of claim 12 wherein when performing a "read" to the memory cell, the first N-type doped region is connected to ground, a voltage level at the second gate exceeding a voltage level at the fourth N-type doped region by a predetermined value, so as to form a channel in the P-type substrate beneath the second gate and conduct the third N-type doped region to the fourth N-type doped region.

14. The electrically erasable programmable logic device of claim 12 wherein when performing a "program" to the memory cell, the first N-type doped region is electrically connected to a high voltage level, the fourth N-type doped region being connected to ground, and the second gate being electrically connected to a voltage value so as to form channel hot holes in the P-type substrate beneath the first gate in order to program the first gate.

15. The electrically erasable programmable logic device of claim 12 wherein when performing an "erase" to the memory cell, the first N-type doped region is electrically connected to a high voltage level, the fourth N-type doped region being connected to ground, and the second gate being electrically connected to a voltage value so as to form channel hot electrons in the P-type substrate beneath the first gate in order to erase the first gate.

16. An electrically erasable programmable logic device as a memory cell of a memory, comprising:

a P-type substrate;

a first N-type doped region in the P-type substrate;

a first gate on the P-type substrate and adjacent to the first N-type doped region, the first gate being in a floating state and used for storing data of the electrically erasable programmable logic device;

a second N-type doped region in the P-type substrate and adjacent to the first gate;

a second gate as a select gate of the electrically erasable programmable logic device, the second gate being on the P-type substrate and adjacent to the second N-type doped region; and a third N-type doped region in the P-type substrate and adjacent to the second gate; wherein the first and second gates are formed in a single polysilicon layer that is the only polysilicon layer disposed on the P-type substrate of the electrically erasable programmable logic device.

17. The electrically erasable programmable logic device of claim 16 wherein the first gate comprises a first oxide layer on a bottom side of the first gate for isolating the P-type substrate and the first gate.

18. The electrically erasable programmable logic device of claim 16 wherein the second gate comprises a second oxide layer on a bottom side of the second gate for isolating the P-type substrate and the second gate.

19. The electrically erasable programmable logic device of claim 16 wherein the memory is an electrically erasable programmable read-only memory.

20. The electrically erasable programmable logic device of claim 16 wherein the memory is a one-time programmable memory.

21. The electrically erasable programmable logic device of claim 16 wherein a plurality of the electrically erasable programmable logic devices as the memory cells of the memory forms an array.

22. The electrically erasable programmable logic device of claim 21 wherein among the electrically erasable programmable logic devices forming the array, the second gates of the electrically erasable programmable logic devices in the same column are electrically connected to one another and to a word line, the third N-type doped regions of the electrically erasable programmable logic devices in the same column being electrically connected to one another and to a source line.

23. The electrically erasable programmable logic device of claim 21 wherein among the electrically erasable programmable logic devices forming the array, the electrically erasable programmable logic devices in adjacent columns are allocated in mirrored symmetry.

24. The electrically erasable programmable logic device of claim 23 wherein among the electrically erasable programmable logic devices in adjacent columns, the electrically erasable programmable logic devices in the same row share the first N-type doped region, the shared first N-type doped region being electrically connected to a bit line.

25. The electrically erasable programmable logic device of claim 23 wherein among the electrically erasable programmable logic devices in adjacent columns, the electrically erasable programmable logic devices in the same row share the third N-type doped region, the shared third N-type doped region being electrically connected to a source line.

26. The electrically erasable programmable logic device of claim 21 wherein among the electrically erasable programmable logic devices forming the array, the first N-type doped regions of the electrically erasable programmable logic devices in the same row are electrically connected to one another and to a bit line.

27. The electrically erasable programmable logic device of claim 16 wherein when the first gate is at a high threshold voltage state, the memory cell stores a logical "0", and when the first gate is at a low threshold voltage state, the memory cell stores a logical "1".

28. The electrically erasable programmable logic device of claim 27 wherein when performing a "read" to the memory cell, the first N-type doped region is connected to ground, a voltage level at the second gate exceeding a voltage level at the third N-type doped region by a predetermined value, so as to form a channel in the P-type substrate beneath the second gate and conduct the second N-type doped region to the third N-type doped region.

29. The electrically erasable programmable logic device of claim 27 wherein when performing a "program" to the memory cell, the first N-type doped region is electrically connected to a high voltage level, the third N-type doped region being connected to ground, and the second gate being electrically connected to a voltage value so as to form channel hot holes in the P-type substrate beneath the first gate in order to program the first gate.

30. The electrically erasable programmable logic device of claim 27 wherein when performing an "erase" to the memory cell, the first N-type doped region is electrically connected to a high voltage level, the third N-type doped region being connected to ground, and the second gate being electrically connected to a voltage value so as to form channel hot electrons in the P-type substrate beneath the first gate in order to erase the first gate.

* * * * *